United States Patent
Farrow et al.

(10) Patent No.: US 9,417,671 B2
(45) Date of Patent: Aug. 16, 2016

(54) COMPUTER BAFFLE

(71) Applicant: Lenovo (Singapore) Pte. Ltd., Singapore (SG)

(72) Inventors: Timothy Samuel Farrow, Cary, NC (US); Ali Kathryn Ent, Garner, NC (US); Shuang Li, Shenzhen (CN); Albert Vincent Makley, Morrisville, NC (US); Sean Hilliard, Anderson, SC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 119 days.

(21) Appl. No.: 14/229,887

(22) Filed: Mar. 29, 2014

(65) Prior Publication Data
US 2015/0277518 A1 Oct. 1, 2015

(51) Int. Cl.
*G06F 1/20* (2006.01)
*H05K 7/20* (2006.01)

(52) U.S. Cl.
CPC .............. *G06F 1/20* (2013.01); *H05K 7/20145* (2013.01); *H05K 7/20727* (2013.01)

(58) Field of Classification Search
None
See application file for complete search history.

(56) References Cited

U.S. PATENT DOCUMENTS

| | | | | |
|---|---|---|---|---|
| 6,462,948 B1 * | 10/2002 | Leija | ................. | H05K 7/20727 165/104.33 |
| 6,504,718 B2 * | 1/2003 | Wu | .................... | H05K 7/20727 165/104.33 |
| 7,215,543 B2 * | 5/2007 | Arbogast | .................. | G06F 1/20 165/121 |
| 8,737,067 B1 * | 5/2014 | Kim | ..................... | H05K 7/1492 342/175 |
| 9,075,581 B2 * | 7/2015 | Stock | ......................... | G06F 1/20 |
| 2002/0134531 A1 * | 9/2002 | Yanagida | ................. | G06F 1/18 165/80.3 |
| 2005/0030712 A1 * | 2/2005 | Faneuf | ............... | H05K 7/20727 361/679.51 |
| 2005/0174678 A1 * | 8/2005 | Zayas | .................... | G11B 19/26 360/73.03 |
| 2007/0133167 A1 * | 6/2007 | Wagner | ............. | H05K 7/20727 361/679.4 |
| 2007/0201205 A1 * | 8/2007 | Holmes | ..................... | G06F 1/20 361/695 |
| 2012/0020013 A1 * | 1/2012 | Li | ..................... | H05K 7/20727 361/679.47 |

* cited by examiner

*Primary Examiner* — Courtney Smith
(74) *Attorney, Agent, or Firm* — Brian J. Pangrle (57) ABSTRACT

A system can include a housing that includes a first opening and a second opening; a baffle disposed in the housing wherein the baffle defines within the housing a first plenum in fluid communication with the first opening and a second plenum in fluid communication with the second opening; a first processor disposed in the first plenum; and a second processor disposed in the second plenum. Various other apparatuses, systems, methods, etc., are also disclosed.

22 Claims, 9 Drawing Sheets

COMPUTER BAFFLE

TECHNICAL FIELD

Subject matter disclosed herein generally relates to technology for a computing system.

COPYRIGHT NOTICE

A portion of the disclosure of this patent document contains material to which a claim for copyright is made. The copyright owner has no objection to the facsimile reproduction by anyone of the patent document or the patent disclosure, as it appears in the Patent and Trademark Office patent file or records, but reserves all other copyright rights whatsoever.

BACKGROUND

A computing system can include various components such as a processor, memory and one or more fans, for example, to move fluid for purposes of heat transfer.

SUMMARY

A system can include a housing that includes a first opening and a second opening; a baffle disposed in the housing wherein the baffle defines within the housing a first plenum in fluid communication with the first opening and a second plenum in fluid communication with the second opening; a first processor disposed in the first plenum; and a second processor disposed in the second plenum. Various other apparatuses, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
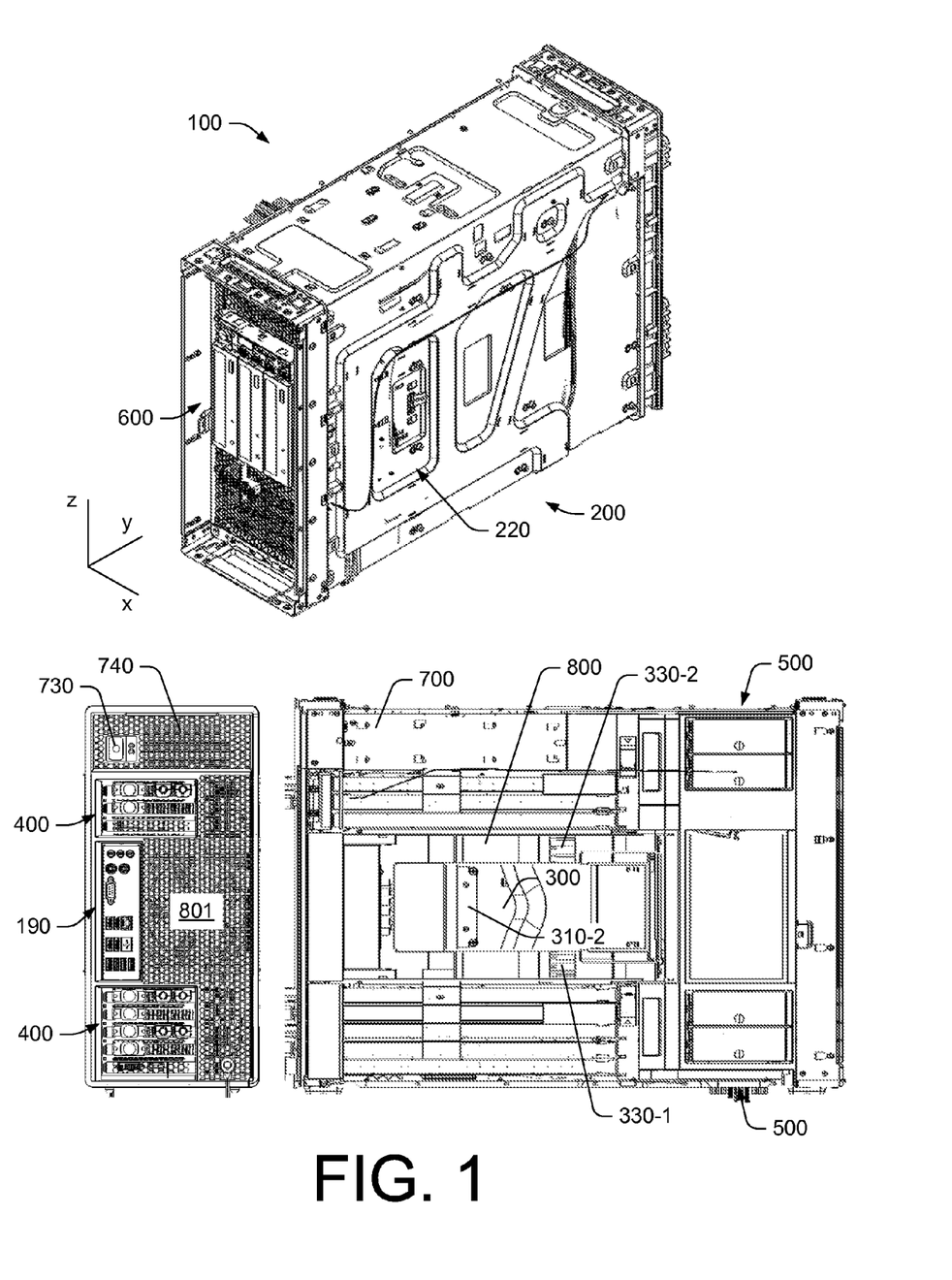
FIG. 1 is a series of diagrams of views of an example of a computing system.

FIG. 1 shows an example of a computing system 100. As an example, the computing system 100 may be a workstation, for example, configured to handle information, which may include one or more of processing information, storing information, receiving information and transmitting information. The computing system 100 can include connectors 190, for example, to connect the computing system 100 to one or more peripherals, networks, etc. As an example, the computing system 100 may include wireless circuitry for wireless connection to one or more peripherals, networks, etc.

As shown in the example of FIG. 1, the computing system includes 100 includes a chassis 200, a board 300, slots 400, bays 500, bays 600, a power supply unit 700 and air flow features 800. As an example, a cover may be fitted to the chassis 200, which may include one or more panels. As an example, a panel may be a lockable panel where, in an unlocked state, it may be removed for access to various components in the computing system 100. As an example, various components may be configured for tool-less installation and removal. As an example, a tool-less configuration may include one or more handles, grips, buttons, levers, etc. that may be manipulated by one or more fingers of a human hand (e.g., or hands). As an example, a tool-less configuration may include guides, for example, for sliding in and sliding out components with respect to the chassis 200.

In the example of FIG. 1, the computing system 100 is shown with respect to a Cartesian coordinate system (x, y, z) and as including a back end and a front end disposed substantially in respective x,z-planes, a top end and a bottom end disposed substantially in respective x,y-planes and a left side and a right side disposed substantially in respective y,z-planes. As to an orientation with respect to gravity, as an example, the computing system 100 may be oriented on its bottom end where gravity may be aligned with the z-axis or, for example, the computing system 100 may be oriented on one of its sides where gravity may be aligned with the x-axis (e.g., with the left side facing upward and the right side facing downward).

In the example of FIG. 1, the chassis 200 includes a mechanism 220 for limiting movement of the board 300 (e.g., at least along the y-axis). As shown, the board 300 may be positioned substantially in a y,z-plane and may include various slots 400 for receipt of one or more components (e.g., cards, etc.), which may extend outwardly from the board 300 (e.g., at least in part along the x-axis).

As to the bays 500 and the bays 600, these may be defined at least in part by the chassis 200. As shown, the bays 500 and the bays 600 may include one or more bays accessible via the front end of the computing system 100 (see, e.g., the bays 600) and may include one or more bays accessible via one or both of the sides of the computing system 100 such as, for example, the left side of the computing system 1100 (see, e.g., the bays 500).

In the example of FIG. 1, the computing system 100 includes the power supply assembly 700, which includes a connector 730 for receipt of power (e.g., via a power cord) and which may include a fan 740 (e.g., or fans). The power supply assembly 700 may provide power to various components of the computing system 100.

As shown in the example of FIG. 1, the chassis 200 includes various openings that may facilitate flow of air. In operation, the front end and the back end of the computing system 100 may be positioned with respective clearances from other environmental structures (e.g., shelves, desks, walls, equipment, etc.), for example, to not unduly hinder flow of air. Air flow through the computing system 100 may be guided by one or more of the air flow features 800. As an example, the computing system 100 may include one or more baffles. As an example, the computing system 100 may include one or more fans. As an example, fans may be operated in series, for example, where air moved by one fan includes air moved by another fan. For example, a fan disposed in a first x,z-plane of the computing system 100 may move air at least in part along the y-axis (e.g., into the computing system 100) where another fan disposed in a second x,z-plane of the computing system 100 receives at least a portion of that air and moves it at least in part along the y-axis (e.g., out of the computing system 100). As mentioned, the power supply assembly 700 may include the fan 740 (e.g., or fans). In the example of FIG. 1, a fan 801 is shown as being disposed in an x,z-plane proximate to the back of the computing system 100.

In the example of FIG. 1 the board 300 of the computing system 100 can include one or more processors 310-1 (e.g., and 310-2, etc.) and memory 330-1 and 330-2 accessible by at least one of the one or more processors (e.g., 310-1, 310-2, etc.). One or more of the bays 500 and/or the bays 600 of the computing system 100 may include one or more storage devices, which may be accessible by at least one of the one or more processors.

Figure 2:
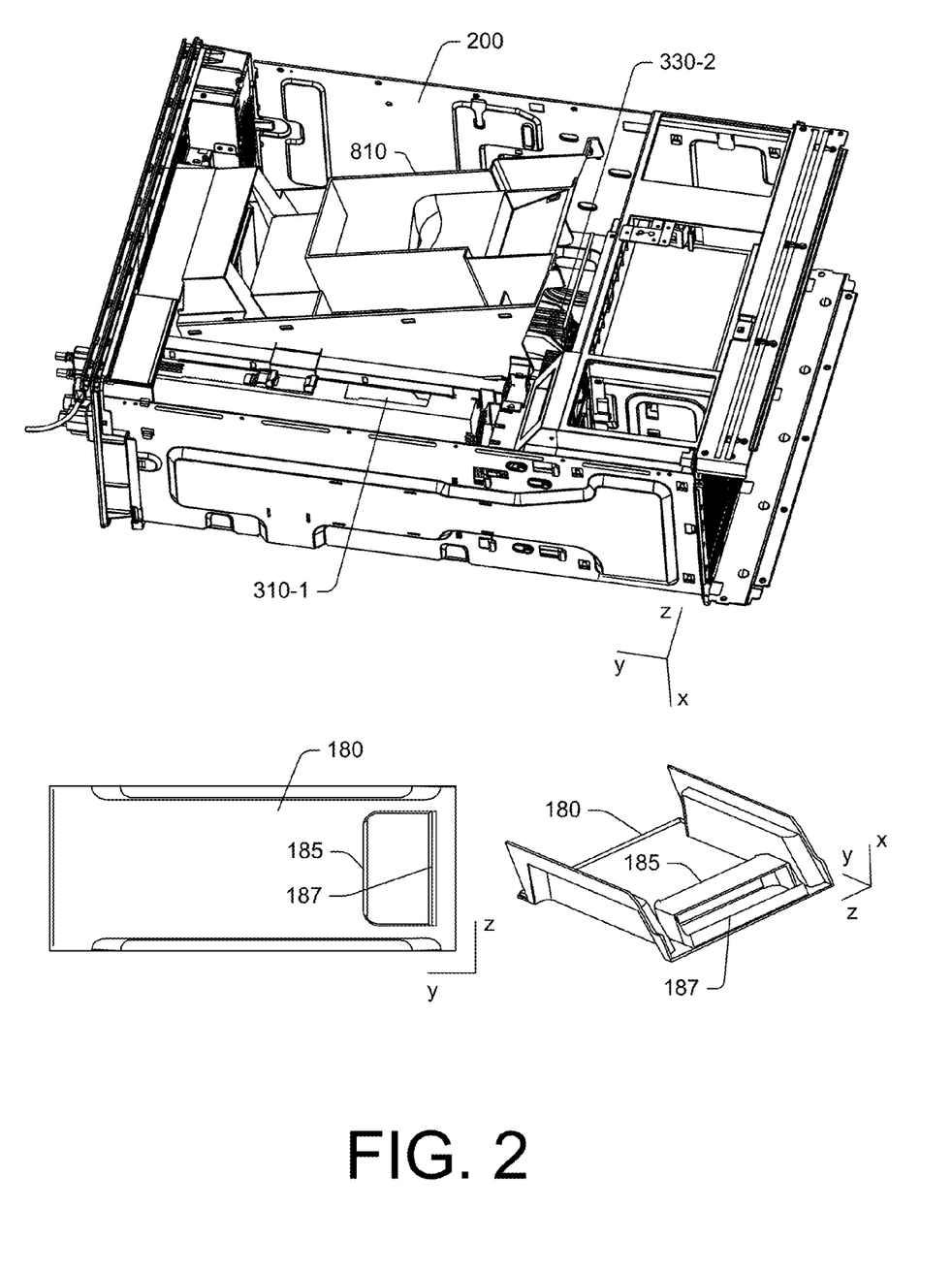
FIG. 2 is a series of diagrams that include a view of a portion of the computing system of FIG. 1 as including an example of a baffle and an example of a component that includes one or more ducts.

FIG. 2 shows a perspective view of a portion of the computing system 100 of FIG. 1 where the chassis 200 may be considered to form at least a portion of a housing of the computing system 100, for example, together with one or more panels. As an example, a panel may include one or more ducts. For example, a side view and a perspective view are shown in FIG. 2 of an example of a component 180 that includes ducts 185 and 187. As an example, the component 180 may be mounted to a panel, be a portion of a panel, etc. Such a component may provide for air flow into or out of a housing of a computing system, for example, via a side of the housing.

As shown in FIG. 2, a baffle 810 may be disposed in a housing of the computing system 100; noting that the baffle 810 is shown as being angled upward at an end, for example, to provide for visibility of various components such as the memory 330-2. In an assembled configuration, the baffle 810 may be seated in the computing system 100, for example, with top edges approximately even with top edges of the chassis 200 (e.g., approximately in a y,z-plane). In the assembled configuration, a panel (e.g., a y,z-plane) may be operatively coupled to the chassis 200, optionally including the component 180. In such an example, one or more of the ducts 185 and 187 may provide for air flow to one or more plena defined at least in part by the baffle 810.

As an example, a portion of the baffle 810 may be configured for air flow to and/or from ducts associated with one or more adapter cards (e.g., PCI cards). As an example, a system may include one or more fans for providing air flow to adapter cards. For example, a fan unit may be disposed at an end of a set of adapter cards to direct air in passages defined by adjacent cards. As an example, a duct may be provided that may provide for air flow from and/or to such passages where an end of the duct may be positioned proximate to a portion of the baffle 810 (e.g., orthogonally to a longitudinal axis of the baffle 810).

Figure 3:
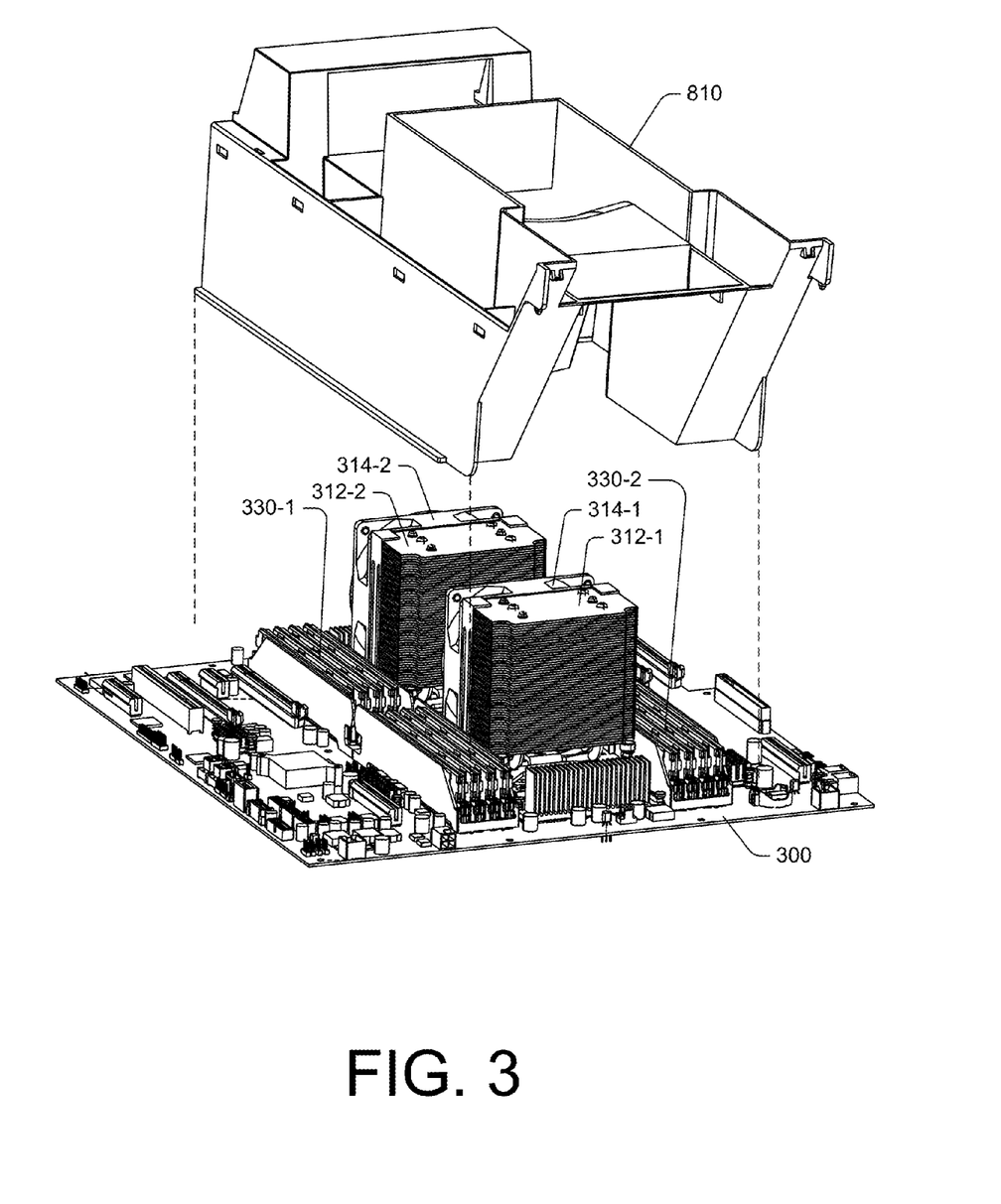
FIG. 3 is a diagram of an exploded view that includes the baffle of FIG. 2 and an example of a board of a computing system.

FIG. 3 shows an exploded perspective view of a portion of the computing system 100 of FIG. 1. In the example of FIG. 3, the memory 330-1 and 330-2 are operatively coupled to the board 300 along with cooling assemblies for a front processor 310-1 and a back processor 310-2. For example, the cooling assemblies include a first set of heat transfer elements 312-1 (e.g., plates, fins, etc.), a first fan 314-1, a second set of heat transfer elements 312-2 (e.g., plates, fins, etc.) and a second fan 314-2. As shown, the cooling assemblies extend outwardly from the board 300 (e.g., in a direction of the x-axis).

As illustrated in FIG. 3, upon lowering of the baffle 810 with respect to the board 300, a front plenum may be defined for fluid communication with the front processor 310-1 (e.g., and a cooling assembly associated therewith) and a back plenum may be defined for fluid communication with the back processor 310-2 (e.g., and a cooling assembly associated therewith). As an example, plena or flow corridors may be defined at least in part by the baffle 810 that are in fluid communication with spaces associated with the memory 330-1 and 330-2. As an example, the front processor 310-1 may include memory slots disposed to one or more sides thereof and the back processor 310-2 may include memory slots disposed to one or more sides thereof. In such an example, the baffle 810 may define plena or flow corridors in fluid communication with such memory slots, for example, where such memory slots may be occupied with one or more memory cards that include memory accessible to a respective processor.

As an example, an assembly may include one or more walls that direct flow of air with respect to memory slots. For example, fences (e.g., solid or with openings) may be disposed to one or two sides of an array of memory slots. Such fences may act to direct air in spaces between memory cards installed in memory slots. In the example of FIG. 3, four sets of fences are included for four sets of memory slots (e.g., two sets for the front processor 310-1 and two sets for the back processor 310-2). As an example, fences may be configured to cooperate with features of the baffle 810 (e.g., with respect to one or more plena, corridors, etc.).

As an example, a system can include a housing that includes a first opening and a second opening; a baffle disposed in the housing where the baffle defines within the housing a first plenum in fluid communication with the first opening and a second plenum in fluid communication with the second opening; a first processor disposed in the first plenum; and a second processor disposed in the second plenum.

Figure 4:
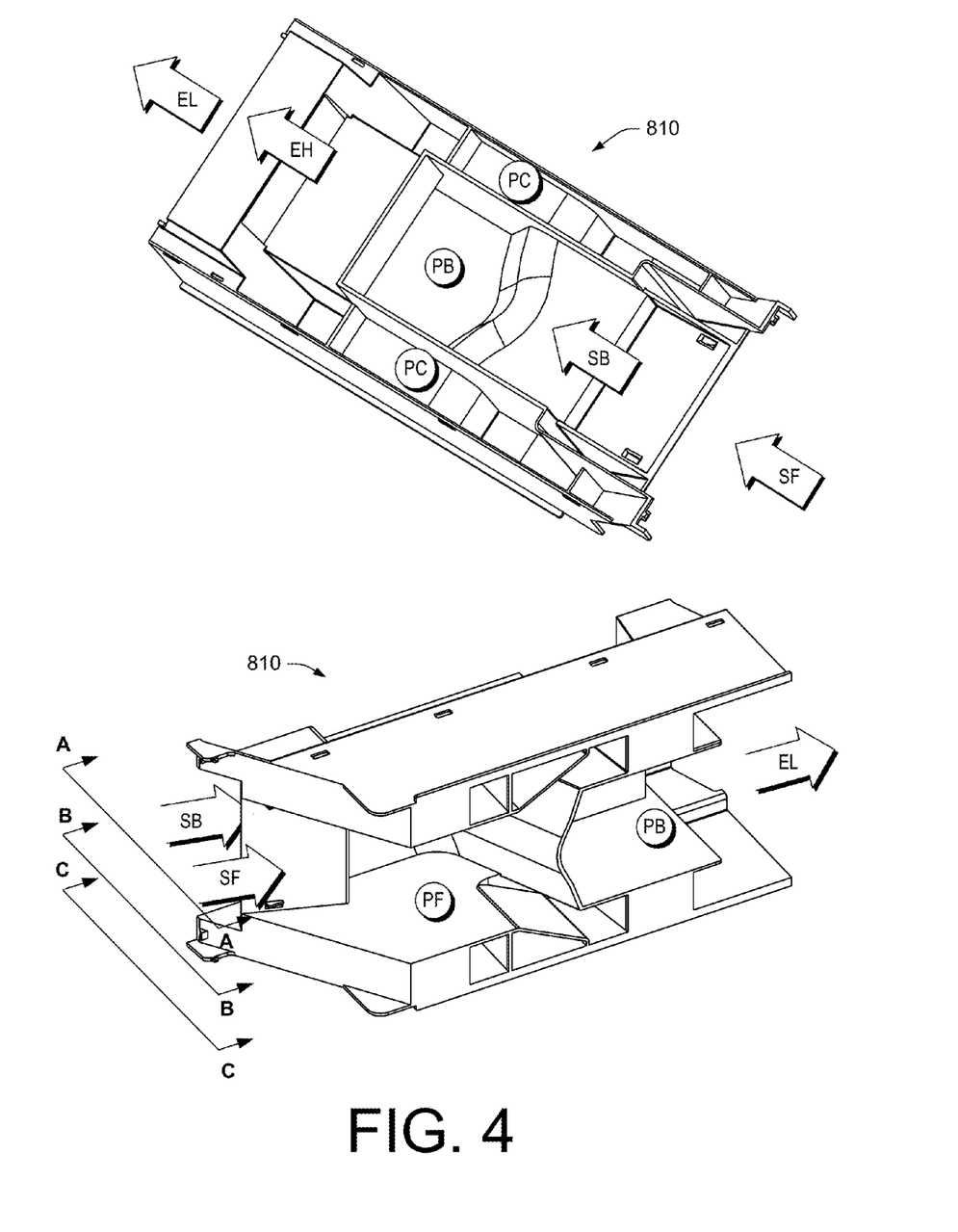
FIG. 4 is a series of diagrams of perspective views of the baffle of FIG. 3.

FIG. 4 shows two perspective views of the baffle 810 and examples of air flow indicated by arrows. For example, supply air (SF) may be for a front processor plenum (PF) and supply air (SB) may be for a back processor plenum (PB). As an example, side plena or corridors may be defined (PC). As an example, flow may be upwards in a side corridor (PC) and downwards in a back processor plenum (PB).

Figure 5:
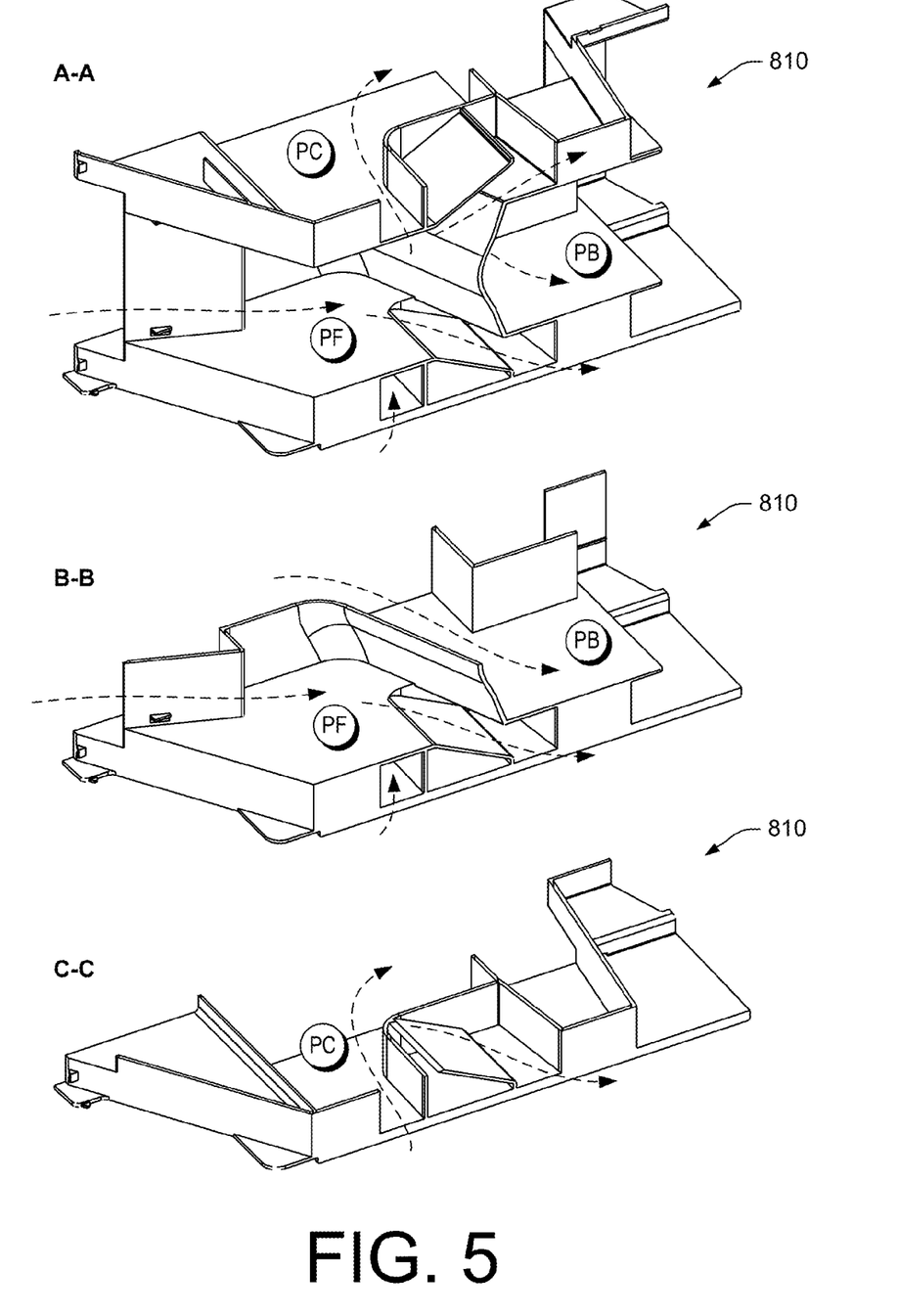
FIG. 5 is a series of diagrams of cutaway views of the baffle of FIG. 3.

FIG. 4 also includes arrows along lines A-A, B-B, and C-C as to cross-sections that are shown in FIG. 5. FIG. 5 includes various dashed lines with arrow heads that indicate possible directions of fluid flow.

Figure 6:
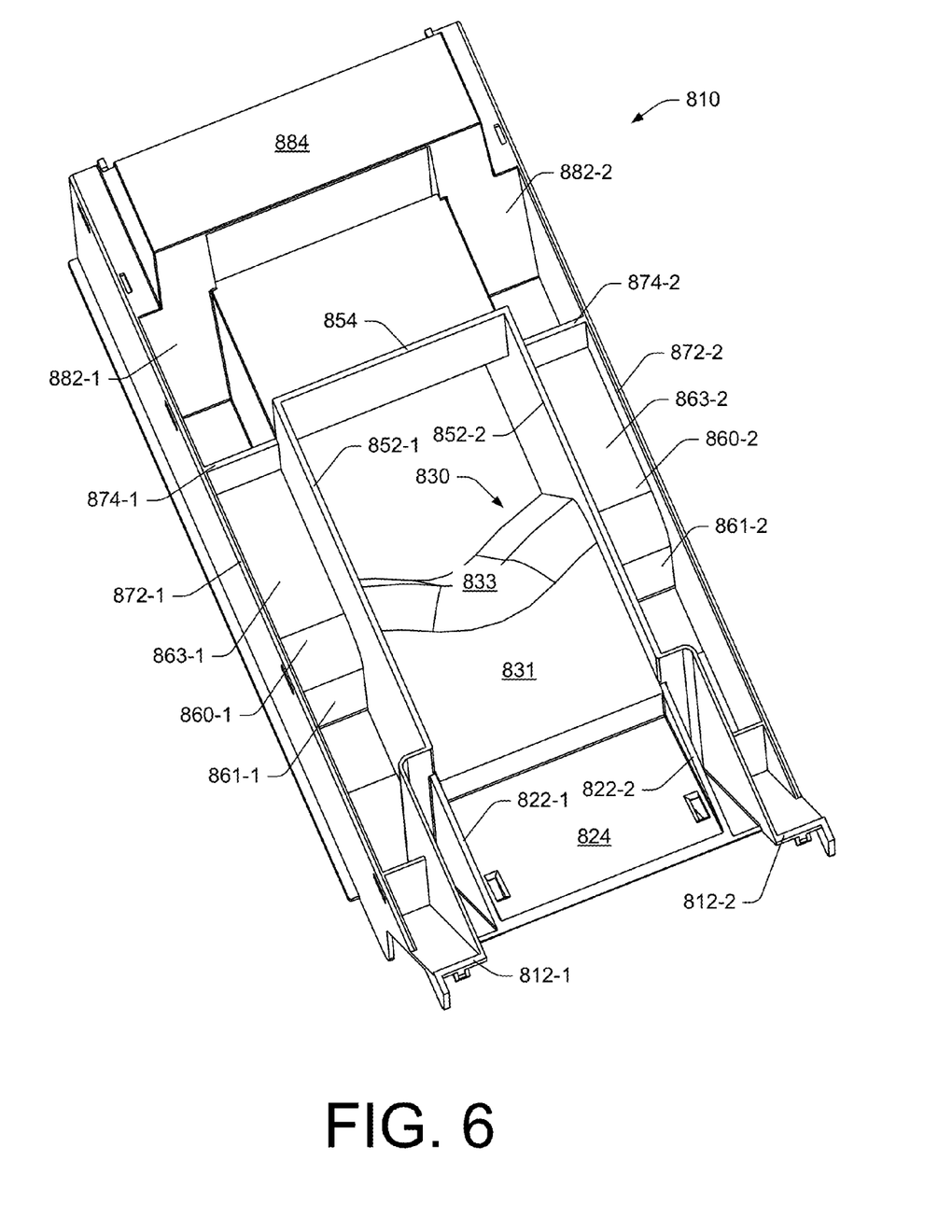
FIG. 6 is a diagram of a perspective view of the baffle of FIG. 3.

FIG. 6 shows a perspective view of the baffle 810. As shown, the baffle 810 can include a wall 830 that includes a first surface (not shown) that defines in part a first plenum (e.g., PF) and a second surface that defines in part a second plenum (e.g., PB). In such an example, the first surface can include a convex surface and the second surface can include a concave surface. As an example, the wall 830 may be referred to as a tongue, for example, having a base portion 831 and a contoured portion 833. As an example, the wall 830 may include an L-shape, for example, defined in part by the base portion 831 and the contoured portion 833 where a bend exists between these two portions.

As an example, the baffle 810 can include side walls 852-1 and 852-2 where the wall 830 is at least in part a curved wall (see, e.g., contoured portion 833) disposed between the side walls 852-1 and 852-2.

Figure 7:
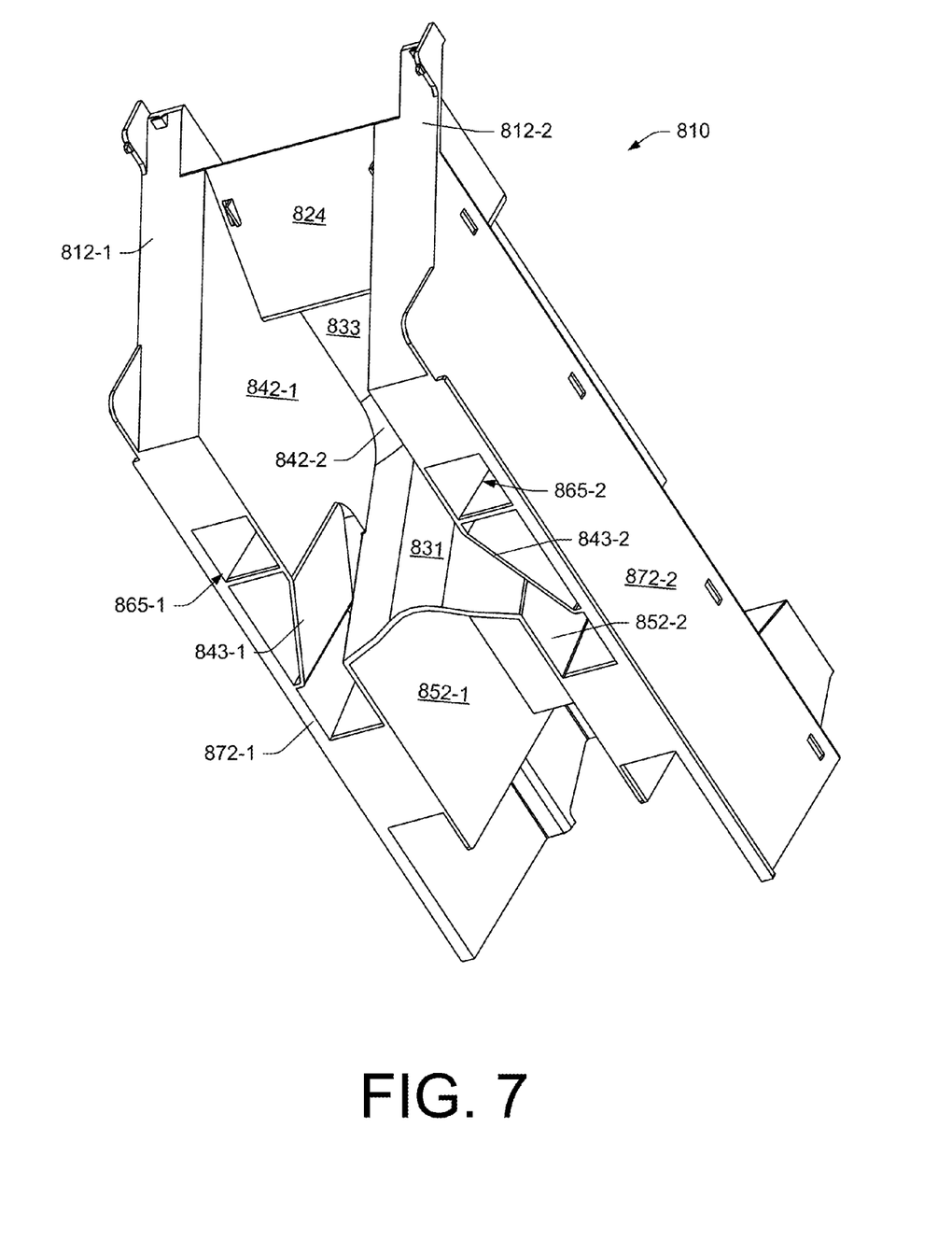
FIG. 7 is a diagram of a perspective view of the baffle of FIG. 3.

FIG. 7 shows a perspective view of the baffle 810. As shown in FIG. 7, the baffle 810 can include a divider wall 842-1 or 842-2 that divides the first plenum (PF) and a side corridor, for example, that includes an opening 865-1 or 865-2. As an example, the baffle 810 may include two side corridors, for example, that include, respectively, the openings 865-1 and 865-2, where one of the side corridors is defined at least in part by a wall 872-1 and the wall 842-1 and where another one of the side corridors is defined at least in part by a wall 872-2 and the wall 842-2. As shown, a wall 843-1 may be disposed between the wall 842-1 and the wall 872-1, for example, that may be disposed at an angle to receive flow guided by the contoured portion 831 of the wall 830. As shown, a wall 843-2 may be disposed between the wall 842-2 and the wall 872-2, for example, that may be disposed at an angle to receive flow guided by the contoured portion 831 of the wall 830.

As shown in the example of FIG. 7, the baffle 810 can include front walls 812-1 and 812-2, which may include a member or wall 824 disposed therebetween, which may, for example, be a divider between plena (e.g., a front plenum and a rear plenum).

As an example, a baffle can include a first side wall, a second side wall, a central wall disposed between the first side wall and the second side wall, a first corridor wall supported by the first side wall and a second corridor wall supported by the second side wall. In such an example, the central wall may include a downward slope angle and the first and second corridor walls may each include a respective upward slope angle. As an example, a baffle may include at least one updraft corridor and at least one downdraft corridor. In such an example, at least one of the at least one updraft corridor may be in fluid communication with a first plenum and/or at least one of the at least one downdraft corridor may be in fluid communication with a second plenum.

As an example, a system may include memory disposed adjacent to a side corridor of a baffle or memory disposed adjacent to side corridors of a baffle.

As an example, a system can include one or more fan. As an example, a system may include fans where at least one of the fans is aligned with a longitudinal flow axis of the first and second plena. As an example, a system may include fans that may be offset along a longitudinal flow axis of plena. As an example, a system may include at least two fans arranged in series.

As an example, a system may include a housing that includes a front end and a back end and at least one fan positioned between the front end of the housing and the back end of the housing and, for example, at least one other fan that is positioned proximate to the back end of the housing. As an example, a system may include a housing that includes a front end and a back end wherein at least one of a plurality of fans is positioned between the front end and the back end of the housing and where at least one of the plurality of fans is positioned proximate to the back end of the housing. In such an example, the system may include a fan as part of a cooling assembly of a processor. As an example, a system may include two fans where each of the two fans is associated with a respective processor, for example, a cooling assembly of that processor.

As an example, a housing can include a front end, a back end and a panel disposed between the front end and the back end that includes an opening, for example, for fluid communication with a plenum. As an example, a housing can include a front end and a back end where the front end includes one or more openings, for example, for fluid communication with a plenum. As an example, a housing can include a panel disposed between a front end and a back end where the panel includes one or more openings, for example, for fluid communication with a plenum (see, e.g., the component 180, which may provide for fluid flow to a back plenum defined in part by the baffle 810).

Figure 8:
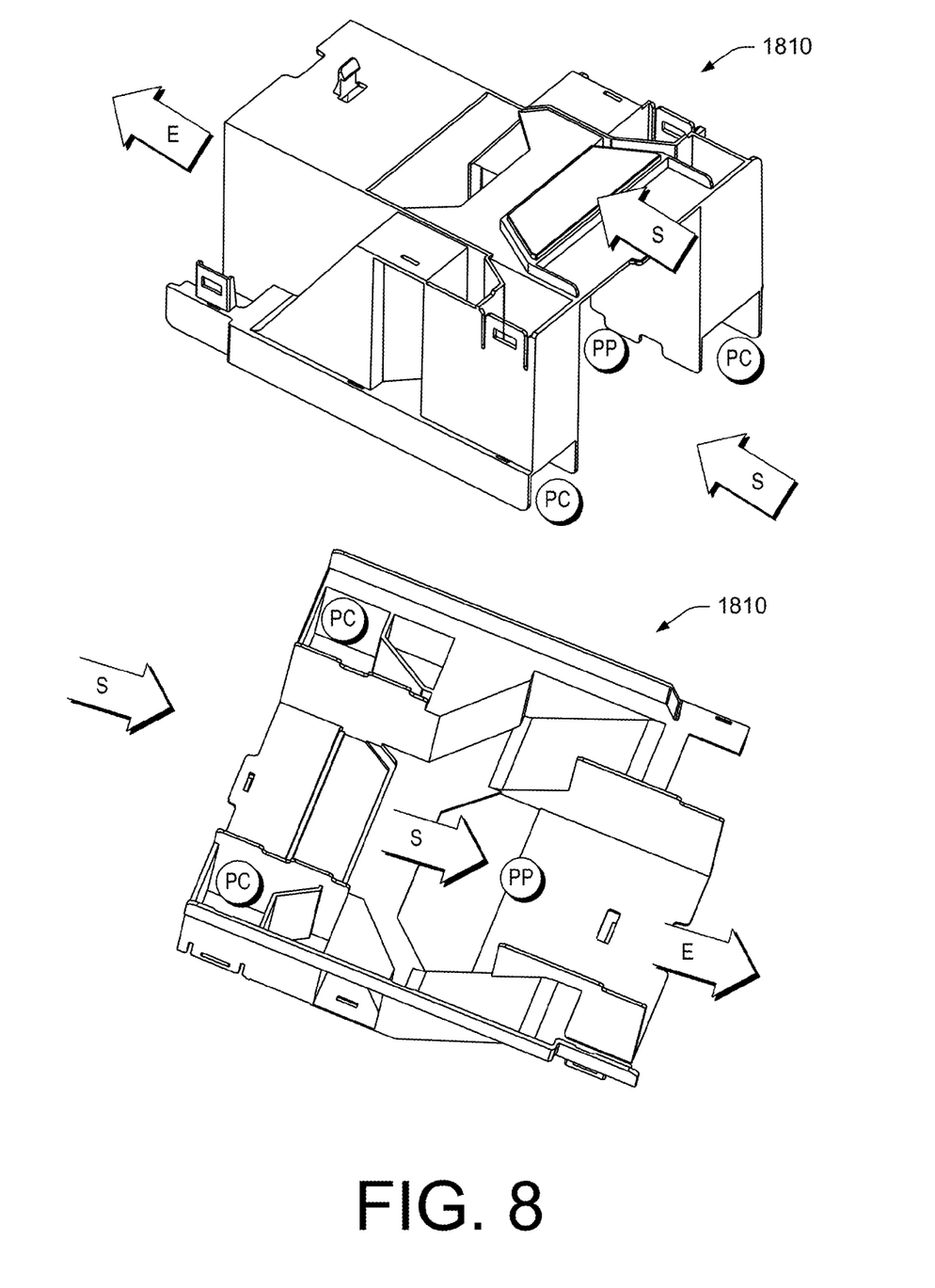
FIG. 8 is a series of diagrams of perspective views of an example of a baffle.

FIG. 8 shows an example of a baffle 1810, which may define a plenum for a processor. For example, the baffle 1810 may define a processor plenum (e.g., PP) and, for example, one or more corridors (e.g., PC). In the example of FIG. 8, supply fluid (S) may be provided via one or more pathways defined at least in part by the baffle 1810 and fluid may exit (E), for example, after flowing via one or more pathways (e.g., plenum, plena, corridor, corridors, etc.) defined at least in part by the baffle 1810.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium. As an example, a computer-readable medium may be a computer-readable medium that is not a carrier wave.

Figure 9:
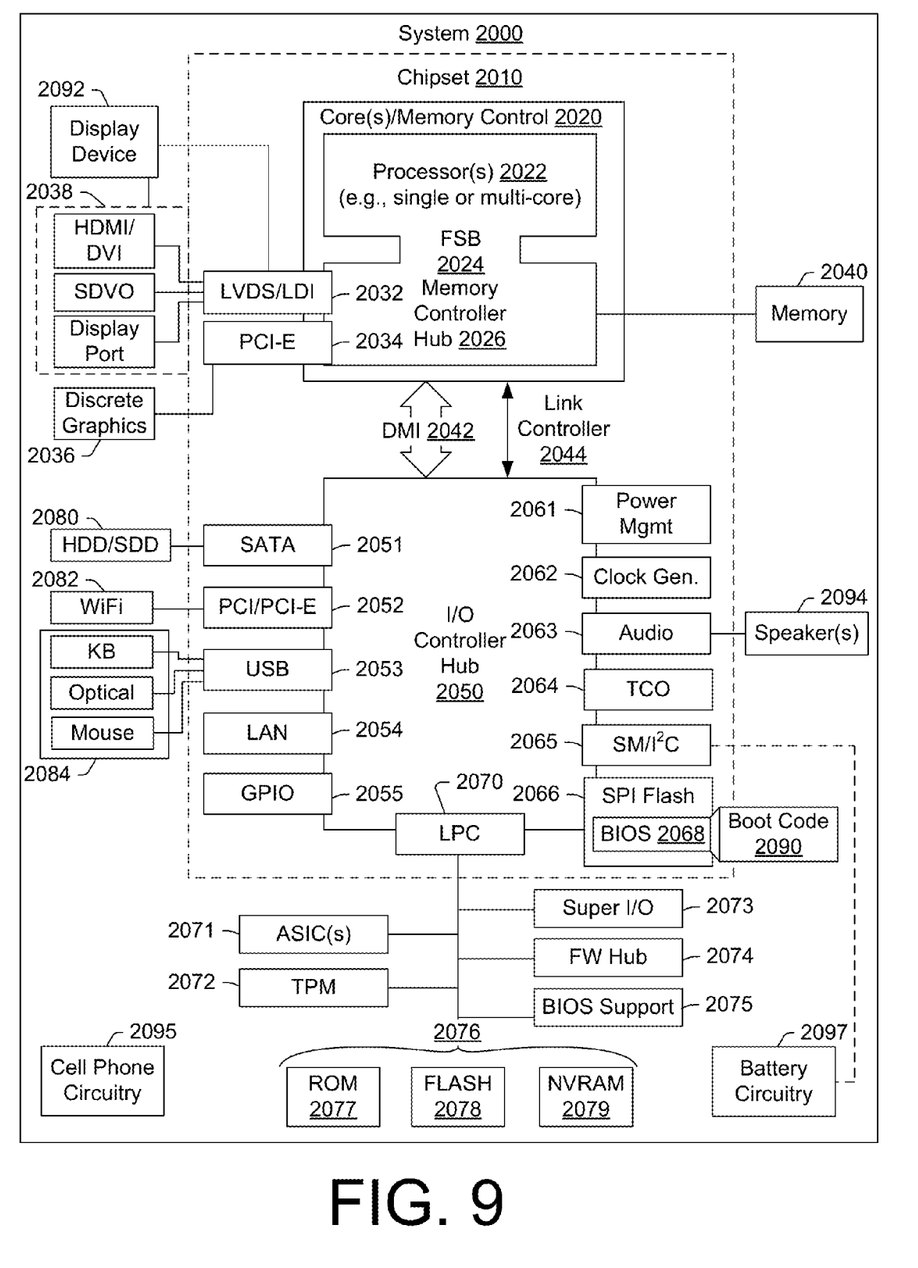
FIG. 9 is a diagram of an example of circuitry of a system, a device, etc.

While various examples of circuits or circuitry may be shown or discussed, FIG. 9 depicts a block diagram of an illustrative computer system 2000. The system 2000 may be a computer system, such as one of the ThinkCentre® or ThinkPad® series of personal computers sold by Lenovo (US) Inc. of Morrisville, N.C., or a workstation computer, such as the ThinkStation® workstation computer sold by Lenovo (US) Inc. of Morrisville, N.C.; however, as apparent from the description herein, a satellite, a base, a server or other machine may include other features or only some of the features of the system 2000 (e.g., consider the ThinkServer® server sold by Lenovo (US) Inc. of Morrisville, N.C.).

As shown in FIG. 9, the system 2000 includes a so-called chipset 2010. A chipset refers to a group of integrated circuits, or chips, that are designed to work together. Chipsets are usually marketed as a single product (e.g., consider chipsets marketed under the brands INTEL®, AMD®, etc.).

In the example of FIG. 9, the chipset 2010 has a particular architecture, which may vary to some extent depending on brand or manufacturer. The architecture of the chipset 2010 includes a core and memory control group 2020 and an I/O controller hub 2050 that exchange information (e.g., data, signals, commands, etc.) via, for example, a direct management interface or direct media interface (DMI) 2042 or a link controller 2044. In the example of FIG. 9, the DMI 2042 is a chip-to-chip interface (sometimes referred to as being a link between a "northbridge" and a "southbridge").

The core and memory control group 2020 include one or more processors 2022 (e.g., single core or multi-core) and a memory controller hub 2026 that exchange information via a front side bus (FSB) 2024. As described herein, various components of the core and memory control group 2020 may be integrated onto a single processor die, for example, to make a chip that supplants the conventional "northbridge" style architecture.

The memory controller hub 2026 interfaces with memory 2040. For example, the memory controller hub 2026 may provide support for DDR SDRAM memory (e.g., DDR, DDR2, DDR3, etc.). In general, the memory 2040 is a type of random-access memory (RAM). It is often referred to as "system memory".

The memory controller hub 2026 further includes a low-voltage differential signaling interface (LVDS) 2032. The LVDS 2032 may be a so-called LVDS Display Interface (LDI) for support of a display device 2092 (e.g., a CRT, a flat panel, a projector, etc.). A block 2038 includes some examples of technologies that may be supported via the LVDS interface 2032 (e.g., serial digital video, HDMI/DVI, display port). The memory controller hub 2026 also includes one or more PCI-express interfaces (PCI-E) 2034, for example, for support of discrete graphics 2036. Discrete graphics using a PCI-E interface has become an alternative approach to an accelerated graphics port (AGP). For example, the memory controller hub 2026 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 2050 includes a variety of interfaces. The example of FIG. 9 includes a SATA interface 2051, one or more PCI-E interfaces 2052 (optionally one or more legacy PCI interfaces), one or more USB interfaces 2053, a LAN interface 2054 (more generally a network interface), a general purpose I/O interface (GPIO) 2055, a low-pin count (LPC) interface 2070, a power management interface 2061, a clock generator interface 2062, an audio interface 2063 (e.g., for speakers 2094), a total cost of operation (TCO) interface 2064, a system management bus interface (e.g., a multi-master serial computer bus interface) 2065, and a serial peripheral flash memory/controller interface (SPI Flash) 2066, which, in the example of FIG. 9, includes BIOS 2068 and boot code 2090. With respect to network connections, the I/O hub controller 2050 may include integrated gigabit Ethernet controller lines multiplexed with a PCI-E interface port. Other network features may operate independent of a PCI-E interface.

The interfaces of the I/O hub controller 2050 provide for communication with various devices, networks, etc. For example, the SATA interface 2051 provides for reading, writing or reading and writing information on one or more drives 2080 such as HDDs, SDDs or a combination thereof. The I/O hub controller 2050 may also include an advanced host controller interface (AHCI) to support one or more drives 2080. The PCI-E interface 2052 allows for wireless connections 2082 to devices, networks, etc. The USB interface 2053 provides for input devices 2084 such as keyboards (KB), one or more optical sensors, mice and various other devices (e.g., microphones, cameras, phones, storage, media players, etc.). On or more other types of sensors may optionally rely on the USB interface 2053 or another interface (e.g., I²C, etc.).

In the example of FIG. 9, the LPC interface 2070 provides for use of one or more ASICs 2071, a trusted platform module (TPM) 2072, a super I/O 2073, a firmware hub 2074, BIOS support 2075 as well as various types of memory 2076 such as ROM 2077, Flash 2078, and non-volatile RAM (NVRAM) 2079. With respect to the TPM 2072, this module may be in the form of a chip that can be used to authenticate software and hardware devices. For example, a TPM may be capable of performing platform authentication and may be used to verify that a system seeking access is the expected system.

The system 2000, upon power on, may be configured to execute boot code 2090 for the BIOS 2068, as stored within the SPI Flash 2066, and thereafter processes data under the control of one or more operating systems and application software (e.g., stored in system memory 2040). An operating system may be stored in any of a variety of locations and accessed, for example, according to instructions of the BIOS 2068. Again, as described herein, a satellite, a base, a server or other machine may include fewer or more features than shown in the system 2000 of FIG. 9. Further, the system 2000 of FIG. 9 is shown as optionally including cell phone circuitry 2095, which may include GSM, CDMA, etc., types of circuitry configured for coordinated operation with one or more of the other features of the system 2000.

CONCLUSION

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A system comprising:
   a housing that comprises a first opening and a second opening;
   a baffle disposed in the housing wherein the baffle defines within the housing a first plenum in fluid communication with the first opening and a second plenum in fluid communication with the second opening;
   a board disposed within the housing substantially in a y,z-plane of a Cartesian coordinate system that comprises x, y and z axes;
   a first processor operatively coupled to the board and disposed in the first plenum;
   a first cooling assembly that extends a distance in a direction of the x-axis from the first processor and that is disposed in the first plenum;
   a second processor operatively coupled to the board and disposed in the second plenum; and
   a second cooling assembly that extends a distance in a direction of the x-axis from the second processor and that is disposed in the second plenum,
   wherein the baffle comprises a tongue disposed in part a distance in a direction of the x-axis from the first cooling assembly and disposed in part between the first and second cooling assemblies.

2. The system of claim 1 wherein the housing comprises a front end, a back end and a panel disposed between the front end and the back end that comprises the second opening.

3. The system of claim 1 wherein the housing comprises a front end and a back end and wherein the front end comprises the first opening.

4. The system of claim 3 wherein the housing comprises a panel disposed between the front end and the back end wherein the panel comprises the second opening.

5. The system of claim 1 wherein the tongue comprises a first surface that defines in part the first plenum and a second surface that defines in part the second plenum.

6. The system of claim 5 wherein the first surface comprises a convex surface and wherein the second surface comprises a concave surface.

7. The system of claim 1 wherein the baffle comprises side walls and wherein the tongue is disposed between the side walls.

8. The system of claim 1 wherein the tongue comprises an L-shape.

9. The system of claim 1 wherein the baffle comprises a divider wall that divides the first plenum and a side corridor.

10. The system of claim 9 comprising memory disposed adjacent to the side corridor.

11. The system of claim 1 wherein the baffle comprises a first side wall, a second side wall, the tongue disposed between the first side wall and the second side wall, a first corridor wall supported by the first side wall and a second corridor wall supported by the second side wall.

12. The system of claim 11 wherein the tongue comprises a downward slope angle and wherein the first and second corridor walls comprise an upward slope angle.

13. The system of claim 1 wherein the baffle comprises at least one updraft corridor and at least one downdraft corridor.

14. The system of claim 13 wherein at least one of the at least one updraft corridor is in fluid communication with the first plenum.

15. The system of claim 13 wherein the at least one of the at least one downdraft corridor is in fluid communication with the second plenum.

16. The system of claim 1 comprising fans.

17. The system of claim 16 wherein the fans comprise a fan aligned with a longitudinal flow axis of the first and second plenums.

18. The system of claim 17 wherein the fans comprise a fan offset along the longitudinal flow axis of the plenums with respect to another fan along the longitudinal flow axis of the plenums.

19. The system of claim 16 wherein at least two of the fans are arranged in series.

20. The system of claim 16 wherein the housing comprises a front end and a back end and wherein at least one of the fans is positioned between the front end and the back end of the housing and wherein at least one of the fans is positioned proximate to the back end of the housing.

21. The system of claim 1 wherein the first cooling assembly comprises a fan and wherein the second cooling assembly comprises a fan.

22. A system comprising:
a housing that comprises a first opening and a second opening;
a baffle disposed in the housing wherein the baffle defines within the housing a first plenum in fluid communication with the first opening and a second plenum in fluid communication with the second opening;
a first processor disposed in the first plenum; and
a second processor disposed in the second plenum,
wherein the baffle comprises a first side wall, a second side wall, a central wall disposed between the first side wall and the second side wall, a first corridor wall supported by the first side wall and a second corridor wall supported by the second side wall and wherein the central wall comprises a downward slope angle and wherein the first and second corridor walls comprise an upward slope angle.

* * * * *